United States Patent

[11] 3,571,914

[72] Inventors Larry G. Lands
Garland;
Will F. Parmer, Dallas, Tex.
[21] Appl. No. 857,615
[22] Filed Aug. 27, 1969
[45] Patented Mar. 23, 1971
[73] Assignee Texas Instruments Incorporated
Dallas, Tex.
Continuation of application Ser. No. 518,234, Jan. 3, 1966, now abandoned.

[54] SEMICONDUCTOR DEVICE STABILIZATION USING DOPED OXIDATIVE OXIDE
4 Claims, 4 Drawing Figs.

[52] U.S. Cl. 29/571, 29/589, 117/106, 117/217, 117/215, 317/235
[51] Int. Cl. H01l 7/00
[50] Field of Search 317/235/21.1; 117/106, 215, 217, 212; 317/235/46; 29/590, 577, 57.6, 571, 589

[56] References Cited

UNITED STATES PATENTS

| | | | |
|---|---|---|---|
| 3,200,019 | 8/1965 | Scott, Jr. et al. | 260/203 |
| 3,334,281 | 8/1967 | Ditrick | 317/235/21.1 |
| 3,343,049 | 9/1967 | Miller et al. | 317/235/21.1 |

*Primary Examiner*—Alfred L. Leavitt
*Assistant Examiner*—C. K. Weiffenbach

ABSTRACT: A stabilized semiconductor device and method of fabrication is disclosed in which a suitably doped silicon oxide stabilization layer for effecting surface passivation is disposed over a surface of a semiconductor device and separated from the surface by a relatively thin layer of silicon oxide to prevent deleterious levels of impurities from diffusing into the surface from the doped stabilization layer.

PATENTED MAR 23 1971 3,571,914

INVENTOR
WILL F. PARMER
LARRY G. LANDS
E. Mickey Hubbard
ATTORNEY

SEMICONDUCTOR DEVICE STABILIZATION USING DOPED OXIDATIVE OXIDE

This application is a continuation of copending application Ser. No. 518,234 filed Jan. 3, 1966, now abandoned.

This invention relates generally to semiconductor devices and more particularly relates to an improved method for stabilizing semiconductor devices.

It is generally known that the surface of a semiconductor device plays a major role in determining the final electrical characteristics of the device. For this reason, semiconductor devices have always been encapsulated in hermetically sealed packages, and the current trend is toward the use of planar geometries covered by a silicon dioxide layer which provides junction passivation. It is also known that an electric field will change the conductivity characteristics of the surface of a semiconductor, and if of sufficient intensity will even induce a surface channel of opposite conductivity type having a depth determined by the strength of the field. The literature available in the semiconductor art indicates that many semiconductor devices which utilize a silicon dioxide passivating layer exhibit various leakage currents, changing breakdown voltages, and a general variation of device parameters over extended periods of time, particularly under high temperature and high bias conditions. Many of these leakage problems and instability problems can be explained as an accumulation or movement of positive charges in the silicon oxide adjacent to the semiconductor which causes a corresponding accumulation or movement of negative charges in the semiconductor at the surface. The excess negative charges at the surface cause the energy bands to bend, and if a sufficiently large quantity of charges accumulate, a P-type semiconductor region can be converted to an N-type region as an inversion layer is formed at the surface. Since a metal-oxide-semiconductor (MOS) field effect transistor depends upon a highly reproducible field induced inversion layer for operation, it is particularly sensitive to any changes in the surface conductivity characteristics as a result of the oxide layer insulating the metal gate from the semiconductor. Previous attempts to solve this problem have been directed toward purifying the oxide by minimizing contamination at all process points because it was believed that impurities in the oxide caused the stray charges. Even if correct, this approach is extremely difficult to implement in high volume production because the source of contamination may not be precisely known. Further, production personnel usually do not have sufficient training and do not exercise sufficient care to fully implement the necessary precautions. Another technique which might be used involves the phosphorous diffusion glassing process described in the Sept. 1964 issue of the IBM Journal. That process results in a phosphorus glass which etches at an extremely rapid rate as compared to silicon dioxide. This is a serious disadvantage for photolithographic processing and a limitation upon its usefulness. The phosphorus glass is not highly reproducible and most of the phosphorus atoms are localized near the surface of the glass remote from the semiconductor and, therefore, are not fully effective.

An important object of this invention is to provide an improved method for stabilizing a semiconductor device against spuriously induced changes in the conductivity characteristics at the surface of the semiconductor.

Another important object is to provide an improved metal-oxide-semiconductor field effect transistor.

Still another important object of the invention is to provide an improved junction device.

These and other objects are accomplished by disposing a layer of silicon dioxide uniformly doped with phosphorus, or other suitable stabilizing agent compatible with silicon dioxide, in close proximity to the surface of the semiconductor to be passivated and stabilized.

In accordance with a more specific aspect of the invention, the phosphorus doped silicon dioxide layer is formed by the oxidation of a mixture of the vapors of tetraethyl orthosilicate (TEOS) and a phosphorus carrier such as trimethyl phosphate.

The doped silicon dioxide layer is particularly useful as the insulating layer between the metal gate and semiconductor of a metal-oxide-semiconductor field effect transistor, in which case an underlying layer of pure silicon dioxide may be used to prevent diffusion of the phosphorus into the semiconductor material.

The doped silicon dioxide is also useful for passivating junction devices in which case the oxide layer may be placed either directly upon the semiconductor material where the diffusion of phosphorus into the semiconductor has no deleterious effect, over a pure silicon dioxide layer only thick enough to prevent the phosphorus from diffusing into the semiconductor to a deleterious level, or in some cases over the silicon dioxide used as a diffusion mask during the fabrication of the device.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
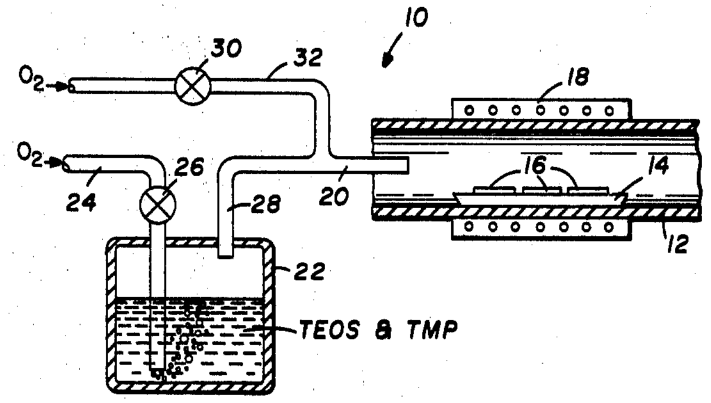
FIG. 1 is a schematic drawing illustrating apparatus which may be used to carry out the process of the present invention.

Referring now to the drawings, and in particular to FIG. 1, a standard tube reactor which may be used to form a phosphorus doped silicon dioxide layer for use in accordance with the present invention is indicated generally by the reference numeral 10. The apparatus 10 is comprised of a standard quartz reactor tube 12 suited to receive a quartz boat carrying semiconductor slices 16. A thermostatically controlled electrical coil 18 is disposed around the tube and is used to heat the semiconductor slices to a preselected temperature. The ends of the reactor tube 12 are open, one end receiving an inlet tube 20, and the other being in communication with a suitable vent hood. A vessel 22 is provided to hold a liquid mixture of tetraethyl orthosilicate and trimethyl phosphate, for example. Oxygen is introduced through a conduit 24 and valve 26 and is bubbled through the liquid mixture in the container 22 and carries vapors of the liquid out through conduit 28 where it may be mixed with additional oxygen from the valve 30 and conduit 32 as required.

In accordance with the broader aspects of this invention, a silicon dioxide layer uniformly doped with a suitable stabilizing agent, such as phosphorus, is used to stabilize the surface of the semiconductor in a semiconductor device. The phosphorus doped silicon dioxide layer may be deposited using the apparatus 10 and the following procedure. The vessel 22 is filled with a mixture of tetraethyl orthosilicate (TEOS) and trimethyl phosphate (TMP). The semiconductor slices 16 are heated to a temperature of from about 400° C. to about 600° C. The temperature is not particularly critical and a temperature of 500° C. is typical. Oxygen is bubbled through the liquid mixture and carries vapors of the liquid out through the conduit 28 where it is mixed with additional oxygen from conduit 32 and passed into the reactor tube 12 by the conduit 20. If desired, oxygen may be bubbled through separate vessels, one containing TEOS and the other TMP, and the two oxygen streams then mixed to mix the reactant vapors prior to passing over the substrates. As the vapors pass over the substrates, a layer of silicon dioxide is formed on the surface of the slices as the result of the chemical action of the tetraethyl orthosilicate. The trimethyl phosphate, which acts as a source for the phosphorus, is also decomposed and the phosphorus is uniformly dispersed throughout the silicon dioxide layer as it is formed.

The ratio of tetraethyl orthosilicate to trimethyl phosphate is not particularly critical, although as the proportion of trimethyl phosphate is increased, a point is reached where the physical characteristics of the oxide become unsatisfactory. About 25 percent trimethyl phosphate and 75 percent tetraethyl orthosilicate by volume produces good results. A mixture of 50 percent trimethyl phosphate has been successfully used. The amount of phosphorus contained in the silicon dioxide layer is of course dependent upon the proportion of trimethyl phosphate present in the liquid mixture. If separate oxygen streams are passed through individual containers for the TEOS and TMP at room temperature and then the two streams mixed, and the TMP stream is 1 percent of the total volume of the mixed streams, then about 100 atoms of phosphorus per million atoms in the silicon dioxide layer can be expected. If the trimethyl phosphate stream is 25 percent, about 1000 atoms per million can be expected, and if the trimethyl phosphate stream is 50 percent, then about 10,000 atoms per million can be expected. The use of the apparatus 10 to deposite a silicon dioxide layer doped with phosphorus by the oxidative decomposition of the vapors of tetraethyl orthosilicate and trimethyl phosphate does not, per se, constitute a part of the present invention, since it is well known that silicon dioxide layers doped with various impurities to a controlled level can be obtained using this process in this type of reactor. The present invention is concerned with the use of a silicon dioxide layer formed by the oxidative decomposition of TEOS, by the pyrolysis of TEOS in an inert atmosphere, by the hydrogen reduction of silanes, or by other similar processes wherein the oxide layer may be uniformly doped by the desired stabilizing agent during formation of the oxide layer for passivation and stabilization of the surface of a semiconductor device. As used in this specification and claims, the term oxidative oxide is intended to include silicon dioxides formed in this manner.

Figure 2:
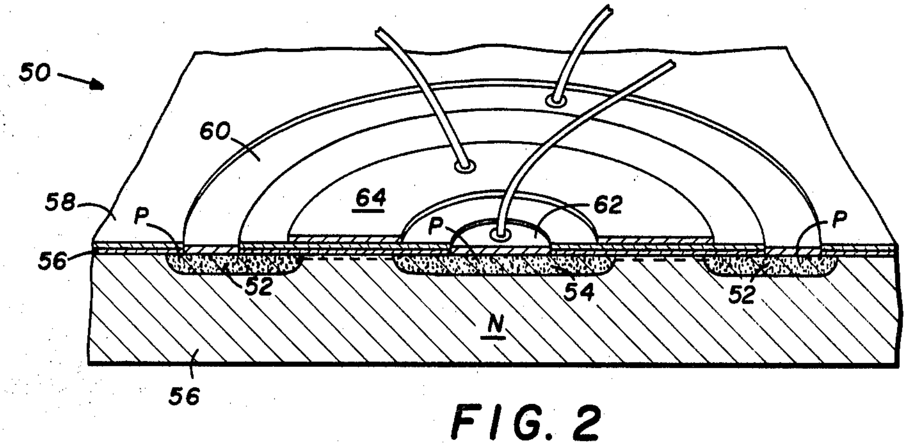
FIG. 2 is a somewhat simplified, partial sectional view of a metal-oxide-semiconductor field effect transistor fabricated in accordance with the present invention.

Referring now to FIG. 2, an improved silicon-oxide-semiconductor field effect transistor fabricated in accordance with the present invention is indicated generally by the reference numeral 50. The P-type diffusion 52 is the source and the P-type diffusion 54 is the drain. The substrate 55 is typically N-type silicon. After the silicon dioxide masking layer through which the source and drain diffusions were made is stripped from the surface of the substrate, a very thin, pure silicon dioxide layer 56 is formed on the surface of the substrate. The silicon dioxide layer 56 may be formed by any convenience process, such as the oxidation or thermal decomposition of tetraethyl orthosilicate at temperatures of from about 400° C. to about 800° C., or if a silicon substrate, by subjecting the substrate to steam or oxygen at a temperature of about 800° C. to about 1200° C. Then a layer 58 of silicon dioxide doped with phosphorus, or other suitable N-type doping impurity, is formed on the pure silicon dioxide layer 56 and over the substrate using the oxidative process heretofore described.

The primary purpose of the pure oxide layer 56 is to act as a diffusion barrier to prevent the diffusion of phosphorus from the doped silicon dioxide layer 58 into the substrate 55. The pure silicon dioxide layer 56 therefore should only be of sufficient thickness to prevent a deleterious amount of phosphorus from reaching the substrate 55, and a thickness on the order of 500 angstroms is usually adequate.

For best results, the oxide layers are then heat treated by raising the substrate to a temperature of about 850° C. for from 15 to 30 minutes. It is postulated that this causes impurities in the undoped oxide layer 56 to migrate to the phosphorus doped oxide layer 58 and also seems to promote some chemical reaction between the phosphorus, silicon dioxide and impurities to form a molecular structure which tends to immobilize the contaminating ions.

The source, drain and gate electrodes 60, 62 and 64 may then be formed by first etching openings in the silicon dioxide layers 56 and 58 using conventional photolithographic techniques, and then depositing and patterning a metallized film using photolithographic techniques. Since the etch rate of the pure silicon dioxide layer 56 and the doped silicon dioxide layer 58 is not excessively different, the doped layer 58, which has the faster etch rate, is not materially undercut during the photolithographic process used to open the windows over the source and drain diffused regions 52 and 54.

Field effect transistors fabricated as illustrated in FIG. 2 have been tested by applying a positive 20 volts to the gate electrode 64, with respect to the substrate 55, in an ambient of 175° C. After about 16 hours, threshold voltage changes of from 10 percent to 20 percent were observed. Transistors having the same geometry and fabricated from the same materials but having an undoped silicon dioxide insulating layer exhibited threshold voltage changes under the same test conditions of from 100 percent to 500 percent.

Figure 3:
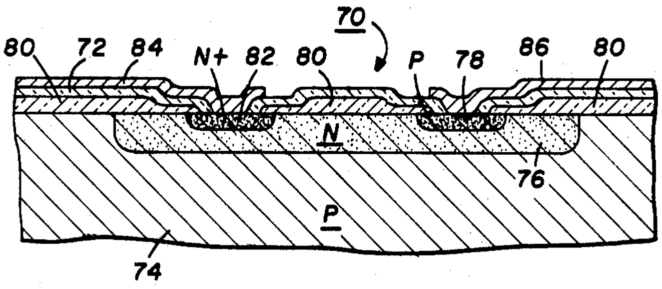
FIG. 3 is a somewhat schematic sectional view of a junction transistor fabricated in accordance with the present invention.

In accordance with another specific aspect of the invention, a junction transistor, such as that indicated generally by the reference numeral 70 in FIG. 3, may also be stabilized by an oxidatively formed phosphorus doped silicon dioxide layer 72. The transistor is comprised of a P-type collector region 74 formed by the semiconductor substrate, a diffused N-type base region 76 and a diffused P-type emitter region 78. After the base and emitter regions 76 and 78 have been diffused through a silicon dioxide diffusion mask 80 using conventional techniques, a pure oxidative silicon dioxide layer (not illustrated) is deposited over the surface of the oxide layer 80. An opening is then made over the base region 76 in both the oxidative oxide layer and the oxide layer 80 while leaving the emitter region 78 covered by the oxidative oxide layer. An N+ base contact region 82 is then diffused through the opening into the base region 76. The dopant for the N+ contact region 82 is often phosphorus which is diffused from a phosphorus glass layer deposited over the surface of the substrate. The diffusion step will normally last for about 6 minutes. Then the substrate is subjected to a deglaze and water boil, the deglazing fluid being a 10 percent solution of hydrofluoric acid, for example, for a sufficient period of time, typically between 1 and 2 minutes, to remove both the phosphorous oxide and the oxidative oxide layers. This reopens the contact windows over both the emitter region 78 and the base contact region 82. Next the phosphorus doped oxidative silicon dioxide layer 72 is deposited over the surface of the substrate by oxidizing a vapor mixture of tetraethyl orthosilicate and trimethyl phosphate as heretofore described. A typical thickness for the layer 72 is from about 3200 to about 3500 angstroms, which is typically produced after a 30 minute deposition period using 25 percent trimethyl phosphate. Openings are then made in the phosphorus doped oxidative oxide layer 72 over the emitter region 78 and base contact region 82 using conventional photolithographic techniques. This is easily accomplished because only the layer 72 must be etched through. Next a suitable metallized film is deposited and patterned to form an expanded base contact 84 and an expanded emitter contact 86.

Transistors prepared as illustrated in FIG. 3 exhibit a failure rate of approximately 1 percent to 2 percent when stressed under high temperature and impressed voltage. This compares with a 100 percent failure rate for transistors having only an undoped silicon dioxide passivating layer under the same conditions. There is some evidence to date that if the percent of trimethyl phosphate in the liquid mixture is less than about 10 percent, the doping level of the phosphorus will not be high enough to always stabilize the transistor.

Figure 4:
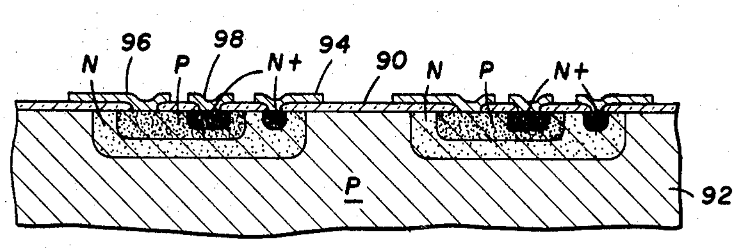
FIG. 4 is a sectional view of an integrated circuit device fabricated in accordance with the present invention.

In accordance with another aspect of the invention, the surface of the active components of an integrated circuit may also be passivated and the circuit stabilized by the application of a phosphorus doped oxidative oxide layer 90 directly upon the cleaned surface of the integrated circuit substrate 92 as illustrated in FIG. 4, provided the diffusion of phosphorus from the doped oxide layer has no deleterious effect upon the devices or substrate. As illustrated, NPN transistors are formed in the substrate by a standard triple diffusion process in a P-type substrate. After the transistors and other active components have been formed, the oxide layer (not illustrated) used as a diffusion mask may be stripped away and the phosphorus doped oxidative oxide layer 90 deposited directly upon the surface of the substrate, then patterned by photolithographic techniques to leave openings over the various diffused regions so that expanded collector, base and emitter contacts 94, 96 and 98, for example, may be formed by conventional techniques. If the amount of phosphorus which is diffused into the substrate 92 from the phosphorus doped silicon dioxide layer 90 produces a deleterious effect, this may be prevented by first depositing a very thin layer of undoped oxidative oxide, such as the layer 56 in FIG. 2, over the substrate and then depositing the phosphorus doped oxidative oxide layer 90 over the pure oxide layer. In such a case, the substrate and oxide layers are then preferably heat treated for a short period of time as heretofore described in connection with the fabrication of the transistor 50.

In general, the phosphorus doped silicon dioxide, or other doped silicon dioxide layers, may be used to improve the stability of any semiconductor device where the instabilities are induced by charge motion within an oxide layer. The doped silicon dioxide has, for example, also been successfully used to stabilize a junction diode used as a pseudo light emitter.

Although various embodiments of the invention have been described in detail, it is to be understood that various changes, substitutions and alterations can be made therein without departing from the spirit and scope of the invention as defined by the appended claims.

We claim:

1. A method for the fabrication of a silicon field effect transistor which comprises:

forming a source region of P-type conductivity in a semiconductor substrate of N-type conductivity;

forming a drain region of P-type conductivity in said substrate, spaced laterally from said source region;

forming a layer at least 500 angstroms thick of substantially pure silicon oxide on the surface of said substrate, covering said source and drain regions;

exposing the resulting oxide-coated structure to a vaporous mixture consisting essentially of an inert gas, a decomposable silicon compound and a decomposable phosphorus compound, at a temperature of 400° C. to about 600° C., under conditions suitable for the deposition of phosphorus-doped silicon oxide, for a time sufficient to deposite a phosphorus-doped silicon oxide layer having a sufficient thickness to enhance the stability of the resulting device;

heating the resulting structure to a temperature of about 850° C. for 15—30 minutes;

selectively etching said phosphorus-doped silicon oxide layer and said pure silicon oxide layer to open windows exposing said source and drain regions;

depositing and patterning a metallization film on said structure, thereby forming ohmic contacts to said source and drain, respectively; and forming a gate electrode to complete said field effect transistor.

2. A method as defined by claim 1 wherein said phosphorus-doped silicon oxide layer has a thickness of about 3200 to 3500 angstroms.

3. A method for the fabrication of a silicon semiconductor device which comprises:

forming at least one diffused region of one conductivity type in a silicon substrate of opposite conductivity type;

forming an undoped silicon oxide layer on the surface of said substrate, covering said diffused region of one conductivity type;

forming a phosphorus-doped silicon oxide layer on said undoped silicon oxide layer by exposing the undoped silicon oxide coated structure to a vaporous mixture consisting essentially of an inert gas, a decomposable silicon compound and a decomposable phosphorus compound, at a temperature of 400° C. to about 600° C., under conditions suitable for the composition of phosphorus-doped silicon oxide, for a time sufficient to deposite a phosphorous-doped silicon oxide layer having a sufficient thickness to enhance the stability of the resulting device;

heating the resulting structure to a temperature of about 850° C. for a time sufficient to cause any impurities in the undoped oxide layer to migrate to the phosphorous-doped layer and thereby to immobilize the contaminating impurities;

selectively etching the undoped silicon oxide layer and the phosphorus-doped silicon oxide layer to form a window exposing the diffused region of one conductivity type; and depositing and patterning a metallization film on said selectively etched structure to form an ohmic contact with said diffused region of one conductivity type.

4. A method as defined by claim 3 wherein said heating period lasts for 15—30 minutes.